(12) United States Patent     (10) Patent No.:   US 12,626,774 B2

Huang et al.     (45) Date of Patent:    May 12, 2026

(54) DISTRIBUTED POWER SUPPLY SWITCHING CIRCUIT FOR EFUSE MEMORY

(71) Applicant: Shanghai Huali Integrated Circuit Corporation, Shanghai (CN)

(72) Inventors: Chuyi Huang, Shanghai (CN); Ying Yan, Shanghai (CN); Shilu Yin, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 98 days.

(21) Appl. No.: 18/744,504

(22) Filed: Jun. 14, 2024

(65) Prior Publication Data

US 2025/0029668 A1     Jan. 23, 2025

(30) Foreign Application Priority Data

Jul. 19, 2023    (CN) .......................... 202310891126.1

(51) Int. Cl.
*G11C 5/14*       (2006.01)
*G11C 5/06*       (2006.01)
*G11C 17/16*      (2006.01)

(52) U.S. Cl.
CPC .............. *G11C 17/16* (2013.01); *G11C 5/063* (2013.01); *G11C 5/147* (2013.01)

(58) Field of Classification Search
CPC ......... G11C 17/16; G11C 5/063; G11C 5/147; G11C 17/18; G11C 16/30; G11C 16/08; G11C 16/24
See application file for complete search history.

(56) References Cited

U.S. PATENT DOCUMENTS

| | | | | |
|---|---|---|---|---|
| 6,229,753 | B1 * | 5/2001 | Kono | ..................... G11C 5/145 365/189.11 |
| 10,826,489 | B1 * | 11/2020 | Stormes | ................. G11C 16/30 |
| 2003/0210600 | A1 * | 11/2003 | Koo | .................... G11C 11/4072 365/226 |
| 2010/0231051 | A1 * | 9/2010 | Yarbrough | ............. H03K 3/356 307/80 |
| 2011/0235454 | A1 * | 9/2011 | Huang | ................. H03K 17/693 327/434 |
| 2011/0304381 | A1 * | 12/2011 | Ku | .................... H03K 3/356113 327/408 |
| 2015/0043265 | A1 * | 2/2015 | Uvieghara | ............. G11C 17/16 327/437 |
| 2019/0027206 | A1 * | 1/2019 | Kim | .................... G11C 11/4074 |

* cited by examiner

*Primary Examiner* — Khamdan N. Alrobaie
(74) *Attorney, Agent, or Firm* — Quarles & Brady LLP

(57)         ABSTRACT

This application provides a distributed power supply switching circuit for an eFuse memory. A distributed power supply domain switching module comprising an internal power supply VDDI, an internal power supply VQR, a first PMOS and a second PMOS. A source of the first PMOS is connected with the internal power supply VDDI, and a gate is connected with the internal power supply VQR. A source of the second PMOS is connected with the internal power supply VQR, and a gate is connected with the internal power supply VDDI. Bulks and drains of the first PMOS and the second PMOS are jointly connected with a node VLS. The distributed power supply domain switching module supplies power to a word line or bit line control module through the node VLS. The circuit of this application can avoiding the risk that the two power supplies are short-circuited.

8 Claims, 3 Drawing Sheets

| External control signal | | Internal control signal | | Internal potential | | |
|---|---|---|---|---|---|---|
| PD | PS | LG | HG | VDDI | VQR | VLS |
| 1 | X | 0 | 0 | 0 | 0 | 0 |
| 0 | 0 | 0 | V(core) | V(core) | 0 | V(core) |
| 0 | 1 | V(prog) | 0 | V(core) | V(prog) | V(prog) |

DISTRIBUTED POWER SUPPLY SWITCHING CIRCUIT FOR EFUSE MEMORY

CROSS-REFERENCES TO RELATED APPLICATIONS

This application claims priority to Chinese patent application No. CN202310891126.1, filed on Jul. 19, 2023 at CNIPA, and entitled "DISTRIBUTED POWER SUPPLY SWITCHING CIRCUIT FOR EFUSE MEMORY", the disclosure of which is incorporated herein by reference in entirety.

TECHNICAL FIELD

This application relates to the field of semiconductor technology, and in particular to a distributed power supply switching circuit for an eFuse memory.

BACKGROUND eFuse memory will switch power supply paths as needed in different working modes to ensure the normal implementation of its functions. In a reading mode, control signals of word lines and bit lines require a lower potential core voltage V(core) for power supply; in a programming mode, the control signals of the word lines and bit lines require a high potential programming voltage V(prog) for power supply.

At present, the commonly used technology in the industry is a circuit illustrated in FIG. 1. VDDI and VQR are two internal power supplies. VDDI is supplied with potential V(core) by the external power supply VDD, and VQR is supplied with potential V(prog) by the external power supply VQPS. A local word line or bit line control module switches power supply VLS through two PMOS transistors. Gates of the PMOS transistors are respectively controlled by two signals LG/HG, the two signals LG/HG are generated in a control module of the memory based on a signal PD and a signal PS. For specific control logic and corresponding potential, see FIG. 2. In order to balance the potential VLS and enhance the power supply capacity of adjacent modules, distributed VLS will be interconnected through a metal line to form a global power supply.

However, the size of the PMOS transistors connected to LG/HG is relatively large. When the memory capacity is large, a large number of power supply switching modules will be called, and the gate capacitance loaded by LG/HG is huge, so the drive for PS to control LG/HG must also be large. Moreover, there is a significant delay in the potential reversal of LG/HG at proximal and distal ends. Especially when PS switches from 0 to 1, LG rises slowly from 0 to higher V(prog), while HG drops quickly from lower V(core) to 0. The two PMOS transistors are turned on simultaneously, causing the two power supplies VDDI and VQR to be short-circuited. If the internal and external power supply switching module works at an intermediate voltage and high current continuously passes through, a risk of IP failure or even chip burnout may be caused.

BRIEF SUMMARY

The present application is to provide a distributed power supply switching circuit for an eFuse memory, which is used for solving the problem that two power supplies are short-circuited because two PMOS transistors of the eFuse power supply switching control circuit in the existing technology are turned on simultaneously.

The distributed power supply switching circuit for an eFuse memory includes the following steps:

a global internal and external power supply conversion module including an external power supply VDD and an external power supply VQPS, the global internal and external power supply conversion module being connected with a signal PD and a signal PS;

a distributed power supply domain switching module including an internal power supply VDDI, an internal power supply VQR, a first PMOS and a second PMOS, a source of the first PMOS being connected with the internal power supply VDDI, a gate being connected with the internal power supply VQR; a source of the second PMOS being connected with the internal power supply VQR, a gate being connected with the internal power supply VDDI; bulks and drains of the first PMOS and the second PMOS being jointly connected with a node VLS; and a word line or bit line control module, the distributed power supply domain switching module supplying power to the word line or bit line control module through the node VLS.

Exemplarily, the node VLS in the distributed power supply domain switching module is interconnected through a metal line to form a global internal power supply.

Exemplarily, when the signal PD is at a low level, the internal power supply VDDI is grounded, and the internal power supply VQR is grounded; when the signal PD is at a high level and the signal PS is at a low level, the potential of the internal power supply VDDI is V(core), and the internal power supply VQR is grounded; when the signal PD is at a high level and the signal PS is at a high level, the potential of the internal power supply VDDI is V(core), and the potential of the internal power supply VQR is V(prog), where V(core) is core voltage and V(prog) is programming voltage.

Exemplarily, the global internal and external power supply conversion module supplies power to the internal power supply VDDI and the internal power supply VQR according to the following mode: when the signal PD is at a high level, power supplied by the external power supplies to the internal power supplies is cut off, and both the internal power supply VDDI and the internal power supply VQR are grounded; when the signal PD is at a low level and the signal PS is at a low level, the external power supply VDD supplies power to the internal power supply VDDI, and the internal power supply VQR is grounded; when the signal PD is at a low level and the signal PS is at a high level, the external power supply VDD supplies power to the internal power supply VDDI, and the external power supply VQPS supplies power to the internal power supply VQR.

Exemplarily, when both the external power supply VDD and the external power supply VQPS have been powered on normally and stabilized, the signal PD switches from a high level to a low level, the signal PS is at a low level, the external power supply VDD powers on the internal power supply VDDI to V(core), the internal power supply VQR remains grounded, the first PMOS is turned on, the second PMOS is turned off, the node VLS remains at the potential of V(core), and the eFuse memory works in a reading mode.

Exemplarily, when the signal PS switches to a high level, the external power supply VQPS powers on the internal power supply VQR; after the potential of the internal power supply VQR rises to more than V(core)−|Vth|, the first PMOS is turned off; as the potential of the internal power supply VQR rises to more than V(core)+Vth, a P-well of the source of the second PMOS and an N-well of a substrate form a PN junction to conduct until the internal power supply VQR powers on the node VLS to V(prog)−Vth, the second PMOS is turned on, finally the potential of the node VLS rises and remains at V(prog), and the eFuse memory works in a programming mode, where Vth is threshold voltage of the PN junction.

Exemplarily, after the programming is completed, the signal PS switches back from a high level to a low level, power supplied by the external power supply VQPS to the internal power supply VQR is cut off, and the internal power supply VQR is powered down to a low level through an NMOS transistor to ground; after the potential of the internal power supply VQR drops to less than V(core)+|Vth|, the second PMOS is turned off; after the potential of the internal power supply VQR continuously drops to V(core)−|Vth|, the first PMOS is turned on, the potential of the node VLS drops to V(core), and the eFuse memory works in a reading mode.

Exemplarily, the distributed power supply switching circuit is used in a single-channel eFuse memory layout.

Exemplarily, the distributed power supply switching circuit is used in a multiple-channel eFuse memory layout.

As described above, the distributed power supply switching circuit for the eFuse memory according to this application has the following beneficial effects: this application simplifies the control signals of the power supply switching module in the existing technology, and controls power supply gating through the potential of the two internal power supplies VDDI and VQR. When the potential of the internal power supply VQR rises from 0 to V(prog), the node VLS can switch to the internal power supply VQR for power supply, and the voltage also rises to V(prog) at the same time; when the potential of VQR drops from V(prog) to 0, VLS can switch to VDDI for power supply, and the voltage also drops to V(core). In the power-on and power-off processes, the possibility that the internal power supplies VQR and VDDI simultaneously supply power to the node VLS will not exist, thus avoiding the risk that the two power supplies are short-circuited. In addition, no additional signal is required to control power supply switching, thus avoiding the risk that the two power supplies are short-circuited due to the delay of the original power supply switching control signal. Moreover, the generation logic and paths of the control signals are simplified, and the layout area is reduced.

DETAILED DESCRIPTION OF THE EMBODIMENTS

The embodiments of this application will be described below through specific examples. Those skilled in the art can easily understand other advantages and effects of this application from the content disclosed in this description. This application may also be implemented or applied through other different specific embodiments. The details in this description may be modified or changed based on different perspectives and applications without departing from the spirit of this application.

Figure 1:
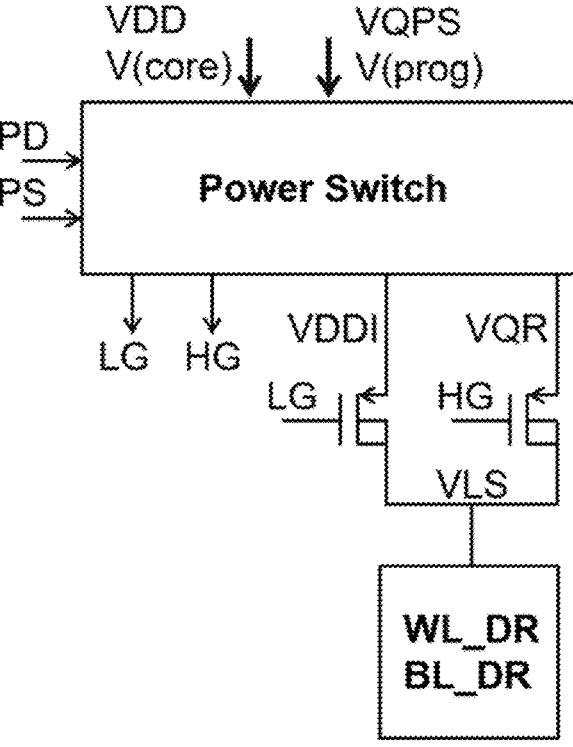
FIG. 1 illustrates a schematic diagram of an eFuse power supply switching control circuit in the existing technology.
Figures 2, 3:
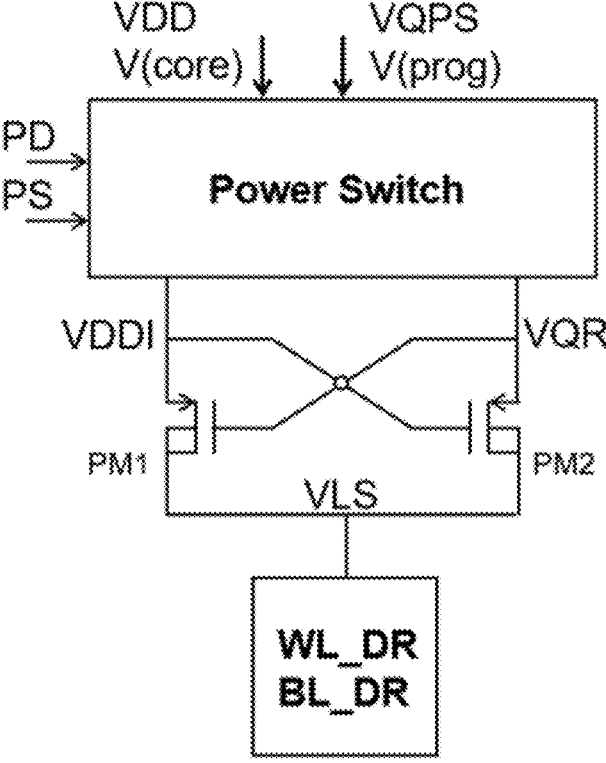
FIG. 2 illustrates control logic and corresponding potential of the circuit in FIG. 1.
FIG. 3 illustrates a schematic structural diagram of a distributed power supply switching circuit for an eFuse memory according to this application.
Figure 4:
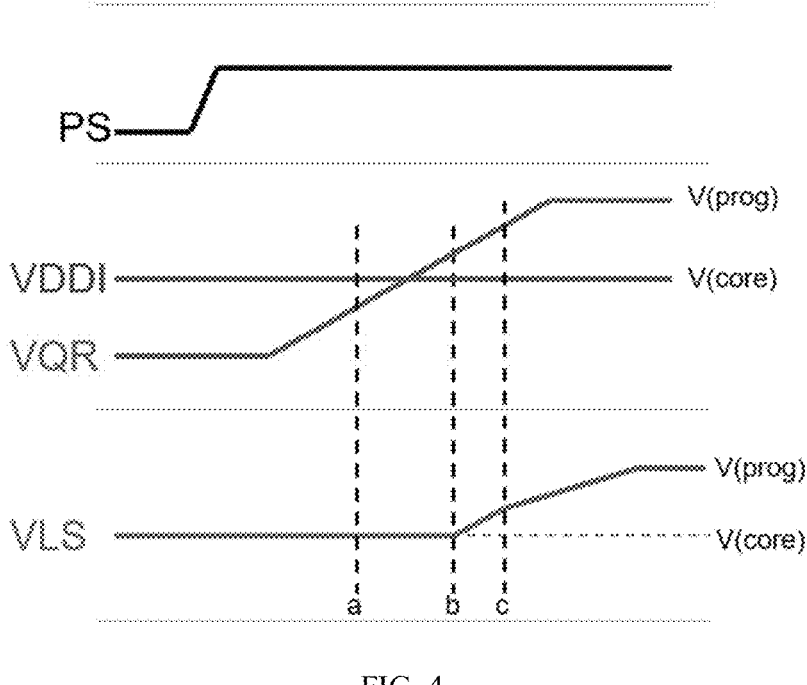
FIG. 4 illustrates a schematic diagram of potential waveforms during voltage rise of a distributed power supply switching circuit for an eFuse memory according to this application.
Figure 5:
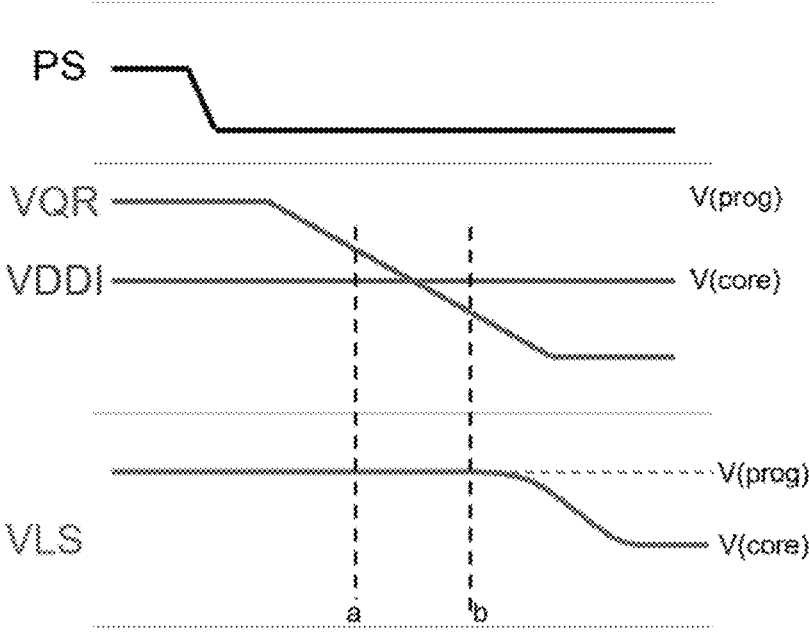
FIG. 5 illustrates a schematic diagram of potential waveforms during voltage drop of a distributed power supply switching circuit for an eFuse memory according to this application.

Please refer to FIG. 3 to FIG. 5. It should be noted that the drawings provided in the embodiments only schematically describe the basic concept of this application, only illustrate the components related to this application, and are not drawn according to the actual number, shape and size of the components during implementation. The type, number and scale of each component during actual implementation may be freely changed, and the layout of the component may be more complex.

This application provides a distributed power supply switching circuit for an eFuse memory. Referring to FIG. 3, it at least includes:

a global internal and external power supply conversion module (Power Switch) including an external power supply VDD and an external power supply VQPS, the global internal and external power supply conversion module being connected with a signal PD and a signal PS;

a distributed power supply domain switching module including an internal power supply VDDI, an internal power supply VQR, a first PMOS (PM1) and a second PMOS (PM2), a source of the first PMOS (PM1) being connected with the internal power supply VDDI, a gate being connected with the internal power supply VQR; a source of the second PMOS (PM2) being connected with the internal power supply VQR, a gate being connected with the internal power supply VDDI; bulks and drains of the first PMOS (PM1) and the second PMOS (PM2) being jointly connected with a node VLS; and a word line or bit line control module (WL_DR/BL_DR), the distributed power supply domain switching module supplying power to the word line or bit line control module through the node VLS.

Further, in this embodiment of this application, the node VLS in the distributed power supply domain switching module is interconnected through a metal line to form a global internal power supply.

Further, in this embodiment of this application, when the signal PD is at a low level (PD=0), the internal power supply VDDI is grounded (VDDI=0), and the internal power supply VQR is grounded (VQR=0); when the signal PD is at a high level (PD=1) and the signal PS is at a low level (PS=0), the potential of the internal power supply VDDI is V(core), and the internal power supply VQR is grounded (VQR=0); when the signal PD is at a high level (PD=1) and the signal PS is at a high level (PS=1), the potential of the internal power supply VDDI is V(core), and the potential of the internal power supply VQR is V(prog), where V(core) is core voltage and V(prog) is programming voltage.

The internal power supply VDDI controls the gate of the first PMOS (PM1) that gates the internal power supply VQR to connect to the node VLS, and the internal power supply VQR controls the gate of the second PMOS (PM2) that gates the internal power supply VDDI to connect to the node VLS.

Further, in this embodiment of this application, the global internal and external power supply conversion module supplies power to the internal power supply VDDI and the internal power supply VQR according to the following mode: when the signal PD is at a high level (PD=1), power supplied by the external power supplies to the internal power supplies is cut off, and both the internal power supply VDDI and the internal power supply VQR are grounded (VDDI=0, VQR=0); when the signal PD is at a low level (PD=0) and the signal PS is at a low level (PS=0), the external power supply VDD supplies power to the internal power supply VDDI, and the internal power supply VQR is grounded (VQR=0); when the signal PD is at a low level (PD=0) and the signal PS is at a high level (PS=1), the external power supply VDD supplies power to the internal power supply VDDI, and the external power supply VQPS supplies power to the internal power supply VQR.

Power supply switching states: when both the external power supply VDD and the external power supply VQPS have been powered on normally and stabilized, the signal PD switches from a high level to a low level (i.e., from PD=1 to PD=0), the signal PS is at a low level (PS=0), the external power supply VDD powers on the internal power supply VDDI to V(core), the internal power supply VQR remains grounded (VQR=0), the first PMOS (PM1) is turned on, the second PMOS (PM2) is turned off, the node VLS remains at the potential of V(core), and the eFuse memory works in a reading mode.

Further, in this embodiment of this application, when the signal PS switches to a high level (PS=1), the external power supply VQPS powers on the internal power supply VQR; after the potential of the internal power supply VQR rises to more than V(core)−|Vth| (point A in FIG. 4), the first PMOS (PM1) is turned off; as the potential of the internal power supply VQR rises to more than V(core)+Vth (point b in FIG. 4), the PN junction formed by the P-well of the source of the second PMOS (PM2) and the N-well of the substrate is conductive until the internal power supply VQR powers on the node VLS to V(prog)−Vth (point c in FIG. 4); since the programming voltage is often above 1.8V, V(prog)−Vth(PN junction)>V(core)+|Vth(PMOS)| and |V(GS)|>|Vth|, the second PMOS (PM2) is turned on, finally the potential of the node VLS rises and remains at V(prog), and the eFuse memory works in a programming mode, where Vth is threshold voltage of the PN junction, as illustrated in FIG. 4.

Further, in this embodiment of this application, after the programming is completed, the signal PS switches back from a high level to a low level (i.e., from PS=1 to PS=0), power supplied by the external power supply VQPS to the internal power supply VQR is cut off, and the internal power supply VQR is powered down to a low level through an NMOS transistor to ground; after the potential of the internal power supply VQR drops to less than V(core)+|Vth| (point a in FIG. 5), the second PMOS is turned off; after the potential of the internal power supply VQR continuously drops to V(core)−|Vth| (point b in FIG. 5), the first PMOS is turned on, the potential of the node VLS drops to V(core), and the eFuse memory works in a reading mode, as illustrated in FIG. 5.

Further, in this embodiment of this application, the distributed power supply switching circuit is used in a single-channel eFuse memory layout. In other embodiments, the distributed power supply switching circuit is used in a multiple-channel eFuse memory layout.

Since this method of controlling power supply switching does not need to generate signals LG/HG in the control module, a lot of area can be saved and be used for other power supply or signal paths. In addition, due to the strong power network of VDDI and VQR that runs through the entire memory, the potential at the proximal end and the distal ends is stable, thus effectively avoiding the risk of short-circuiting due to the fact that the two power supplies are conducted simultaneously during power supply switching.

To sum up, this application simplifies the control signals of the power supply switching module in the existing technology, and controls power supply gating through the potential of the two internal power supplies VDDI and VQR. When the potential of the internal power supply VQR rises from 0 to V(prog), the node VLS can switch to the internal power supply VQR for power supply, and the voltage also rises to V(prog) at the same time; when the potential of VQR drops from V(prog) to 0, VLS can switch to VDDI for power supply, and the voltage also drops to V(core). In the power-on and power-off processes, the possibility that the internal power supplies VQR and VDDI simultaneously supply power to the node VLS will not exist, thus avoiding the risk that the two power supplies are short-circuited. In addition, no additional signal is required to control power supply switching, thus avoiding the risk that the two power supplies are short-circuited due to the delay of the original power supply switching control signal. Moreover, the generation logic and paths of the control signals are simplified, and the layout area is reduced. Therefore, this application effectively overcomes various disadvantages in the existing technology and thus has a great industrial utilization value.

The above embodiments only exemplarily describe the principle and effect of this application, and are not intended to limit this application. Those skilled in the art may modify or change the above embodiments without departing from the spirit and scope of this application. Therefore, all equivalent modifications or changes made by those skilled in the art without departing from the spirit and technical concept disclosed in this application should still be covered by the claims of this application.

What is claimed is:

1. A distributed power supply switching circuit for an eFuse memory, at least comprising:

a global internal and external power supply conversion module comprising an external power supply VDD and an external power supply VQPS, the global internal and external power supply conversion module being connected with a signal PD and a signal PS;

a distributed power supply domain switching module comprising an internal power supply VDDI, an internal power supply VQR, a first PMOS and a second PMOS, a source of the first PMOS being connected with the internal power supply VDDI, a gate being connected with the internal power supply VQR; a source of the second PMOS being connected with the internal power supply VQR, a gate being connected with the internal power supply VDDI; bulks and drains of the first PMOS and the second PMOS being jointly connected with a node VLS; and a word line or bit line control module for eFuse memory, the distributed power supply domain switching module supplying power to the word line or bit line control module for eFuse memory through the node VLS;

when the signal PS switches to a high level, the external power supply VQPS powers on the internal power supply VQR; after the potential of the internal power supply VQR rises to more than V(core)−|Vth|, the first PMOS is turned off; as the potential of the internal power supply VQR rises to more than V(core)+Vth, a P-well of the source of the second PMOS and an N-well of a substrate form a PN junction to conduct until the internal power supply VQR powers on the node VLS to V(prog)−Vth, the second PMOS is turned on, finally the potential of the node VLS rises and remains at V(prog), and the eFuse memory works in a programming mode, where Vth is threshold voltage of the PN junction.

2. The distributed power supply switching circuit for the eFuse memory according to claim 1, wherein the node VLS in the distributed power supply domain switching module is interconnected through a metal line to form a global internal power supply.

3. The distributed power supply switching circuit for the eFuse memory according to claim 1, wherein when the signal PD is at a low level, the internal power supply VDDI is grounded, and the internal power supply VQR is grounded; when the signal PD is at a high level and the signal PS is at a low level, the potential of the internal power supply VDDI is V(core), and the internal power supply VQR is grounded; when the signal PD is at a high level and the signal PS is at a high level, the potential of the internal power supply VDDI is V(core), and the potential of the internal power supply VQR is V(prog), where V(core) is core voltage and V(prog) is programming voltage.

4. The distributed power supply switching circuit for the eFuse memory according to claim 1, wherein the global internal and external power supply conversion module supplies power to the internal power supply VDDI and the internal power supply VQR according to the following mode: when the signal PD is at a high level, power supplied by the external power supplies to the internal power supplies is cut off, and both the internal power supply VDDI and the internal power supply VQR are grounded; when the signal PD is at a low level and the signal PS is at a low level, the external power supply VDD supplies power to the internal power supply VDDI, and the internal power supply VQR is grounded; when the signal PD is at a low level and the signal PS is at a high level, the external power supply VDD supplies power to the internal power supply VDDI, and the external power supply VQPS supplies power to the internal power supply VQR.

5. The distributed power supply switching circuit for the eFuse memory according to claim 1, wherein when both the external power supply VDD and the external power supply VQPS have been powered on normally and stabilized, the signal PD switches from a high level to a low level, the signal PS is at a low level, the external power supply VDD powers on the internal power supply VDDI to V(core), the internal power supply VQR remains grounded, the first PMOS is turned on, the second PMOS is turned off, the node VLS remains at the potential of V(core), and the eFuse memory works in a reading mode.

6. The distributed power supply switching circuit for the eFuse memory according to claim 1, wherein after the programming is completed, the signal PS switches back from a high level to a low level, power supplied by the external power supply VQPS to the internal power supply VQR is cut off, and the internal power supply VQR is powered down to a low level through an NMOS transistor to ground; after the potential of the internal power supply VQR drops to less than V(core)+|Vth|, the second PMOS is turned off; after the potential of the internal power supply VQR continuously drops to V(core)−|Vth|, the first PMOS is turned on, the potential of the node VLS drops to V(core), and the eFuse memory works in a reading mode.

7. The distributed power supply switching circuit for the eFuse memory according to claim 1, wherein the distributed power supply switching circuit is used in a single-channel eFuse memory layout.

8. The distributed power supply switching circuit for the eFuse memory according to claim 1, wherein the distributed power supply switching circuit is used in a multiple-channel eFuse memory layout.

\* \* \* \* \*